(12) United States Patent
Park et al.

(10) Patent No.: US 9,171,825 B2
(45) Date of Patent: Oct. 27, 2015

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Sang-Sick Park, Seoul (KR); In-Young Lee, Yongin-si (KR); Byoung-Soo Kwak, Seoul (KR); Min-Soo Kim, Gumi-si (KR); Sang-Wook Park, Hwaseong-si (KR); Tae-Je Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/488,707

(22) Filed: Sep. 17, 2014

(65) Prior Publication Data

US 2015/0130083 A1 May 14, 2015

(30) Foreign Application Priority Data

Nov. 14, 2013 (KR) ........................ 10-2013-0138448

(51) Int. Cl.
| | |
|---|---|
| *H01L 23/48* | (2006.01) |
| *H01L 25/065* | (2006.01) |
| *H01L 21/56* | (2006.01) |
| *H01L 23/31* | (2006.01) |
| *H01L 23/36* | (2006.01) |
| *H01L 23/498* | (2006.01) |

(52) U.S. Cl.
CPC .......... *H01L 25/0657* (2013.01); *H01L 21/563* (2013.01); *H01L 23/3157* (2013.01); *H01L 23/36* (2013.01); *H01L 23/481* (2013.01); *H01L 23/49816* (2013.01); *H01L 2224/16225* (2013.01); *H01L 2224/73204* (2013.01); *H01L 2924/15311* (2013.01)

(58) Field of Classification Search
CPC ......... H01L 21/78; H01L 21/82; H01L 25/00; H01L 25/0657; H01L 25/50; H01L 24/97; H01L 24/94
USPC ........................................... 438/108; 257/777
See application file for complete search history.

(56) References Cited

U.S. PATENT DOCUMENTS

| | | | |
|---|---|---|---|
| 6,555,917 B1* | 4/2003 | Heo | 257/777 |
| 7,081,668 B2 | 7/2006 | Briar | |
| 7,791,209 B2 | 9/2010 | Hisada et al. | |
| 8,377,745 B2 | 2/2013 | Shimada et al. | |
| 2005/0104183 A1* | 5/2005 | Kuroda et al. | 257/686 |

(Continued)

FOREIGN PATENT DOCUMENTS

KR 1020010076678 8/2001

*Primary Examiner* — Trung Q Dang
(74) *Attorney, Agent, or Firm* — Ellsworth IP Group PLLC

(57) ABSTRACT

A semiconductor device and a method of fabricating the same includes providing a first semiconductor chip which has first connection terminals, providing a second semiconductor chip which comprises top and bottom surfaces facing each other and has second connection terminals and a film-type first underfill material formed on the bottom surface thereof, bonding the first semiconductor chip to a mounting substrate by using the first connection terminals, bonding the first semiconductor chip and the second semiconductor chip by using the first underfill material, and forming a second underfill material which fills a space between the mounting substrate and the first semiconductor chip and covers side surfaces of the first semiconductor chip and at least part of side surfaces of the second semiconductor chip.

22 Claims, 15 Drawing Sheets

(56) References Cited

U.S. PATENT DOCUMENTS

| | | |
|---|---|---|
| 2007/0007639 A1 | 1/2007 | Fukazawa |
| 2010/0258933 A1* | 10/2010 | Fujishima et al. ............ 257/686 |
| 2010/0261311 A1 | 10/2010 | Tsuji |
| 2011/0057327 A1 | 3/2011 | Yoshida et al. |
| 2011/0272825 A1 | 11/2011 | McGrath et al. |
| 2012/0119354 A1 | 5/2012 | Tsai et al. |
| 2012/0126402 A1 | 5/2012 | Hatakeyama et al. |
| 2012/0228762 A1 | 9/2012 | Fukuda et al. |
| 2012/0252165 A1 | 10/2012 | Nakanoya et al. |
| 2012/0270370 A1 | 10/2012 | Ihara |
| 2013/0001709 A1 | 1/2013 | Liu |
| 2013/0234320 A1* | 9/2013 | Lu et al. ........................ 257/737 |

* cited by examiner

SEMICONDUCTOR DEVICE AND METHOD OF FABRICATING THE SAME

CROSS-REFERENCE TO RELATED APPLICATIONS

This application claims priority under 35 U.S.C. §119 from Korean Patent Application No. 10-2013-0138448 filed on Nov. 14, 2013 in the Korean Intellectual Property Office, the disclosure of which is incorporated herein by reference in its entirety.

BACKGROUND

1. Field

The present inventive concept relates to a semiconductor device and a method of fabricating the same.

2. Description of the Related Art

The current trend in the electronics industry is to fabricate lighter, smaller, faster and higher-performance products with multiple functions at low costs. To meet this trend, multi-chip stacked packaged technology or system in package technology is used. The multi-chip stacked package technology or the system in package technology uses substrate-through vias.

Since a number of semiconductor chips are used in a semiconductor package, heat generated from the semiconductor chips is becoming a matter of great concern. Therefore, a lot of research is being conducted to effectively dissipate heat generated in the semiconductor package.

SUMMARY

The present general inventive concept provides a method of fabricating a semiconductor device, the method being employed to improve a thermal characteristic of a semiconductor package by exposing a top surface of the semiconductor package including a stack of a plurality of semiconductor chips.

The present general inventive concept provides a semiconductor device fabricated using the above method.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a fabricating method of a semiconductor device, the fabricating method including providing a first semiconductor chip which has first connection terminals, providing a second semiconductor chip which has top and bottom surfaces facing each other and also has second connection terminals and a film-type first underfill material formed on the bottom surface thereof, bonding the first semiconductor chip to a mounting substrate by using the first connection terminals, bonding the first semiconductor chip and the second semiconductor chip by using the first underfill material, and forming a second underfill material which fills a space between the mounting substrate and the first semiconductor chip and covers side surfaces of the first semiconductor chip and at least part of side surfaces of the second semiconductor chip.

The foregoing and/or other features and utilities of the present general inventive concept may also be achieved by providing a fabricating method of a semiconductor device, the fabricating method including electrically connecting a first semiconductor chip having first connection terminals to a mounting substrate by using the first connection terminals, bonding the first semiconductor chip connected to the mounting substrate to a second semiconductor chip by using a film-type first underfill material, plasma-treating the mounting substrate, the first semiconductor chip, and the second semiconductor chip, and forming a second underfill material, which covers the first connection terminals, fills a space between the mounting substrate and the first semiconductor chip, and covers side surfaces of the first semiconductor chip and at least part of side surfaces of the second semiconductor chip, by using a capillary underfill method after the plasma-treating of the mounting substrate, the first semiconductor chip, and the second semiconductor chip.

The foregoing and/or other features and utilities of the present general inventive concept may also be achieved by providing a semiconductor device including a mounting substrate, a first semiconductor chip having a first width and being spaced apart from the mounting substrate on the mounting substrate, a film-type first underfill material placing on the first semiconductor chip, a second semiconductor chip having a second width and placing on the first underfill material, thereby bonding the first semiconductor chip and the second semiconductor chip through the film-type first underfill material, and a second underfill material filling a space between the mounting substrate and the first semiconductor chip and covering side surfaces of the first semiconductor chip and at least part of side surfaces of the second semiconductor chip.

The foregoing and/or other features and utilities of the present general inventive concept may also be achieved by providing a semiconductor device usable with an electronic apparatus, the semiconductor device including a mounting substrate, a first semiconductor chip disposed on a top surface of the mounting substrate, a second semiconductor chip disposed over the first semiconductor chip, one or more connection terminals electrically connecting the first semiconductor chip and the second semiconductor chip, and a material unit having a first material disposed between the first semiconductor chip and the second semiconductor chip and surrounding the one or more connection terminals, and also having a second material disposed to cover portions of the first material, the first semiconductor chip, and the second semiconductor chip, the material unit having a curved boundary formed at a contact area of the first material and the second material.

The curved boundary may include opposite ends respectively contacting the first semiconductor chip and the second semiconductor chip and a middle portion being curved between the opposite ends.

The curved boundary may include a middle portion protruding from at least one of the first semiconductor chip and the second semiconductor chip in a lateral direction.

The second material is not disposed on a top surface of the second semiconductor chip.

The foregoing and/or other features and utilities of the present general inventive concept may also be achieved by providing an electronic apparatus including a semiconductor device described above or hereinafter, and a controller to control the semiconductor device to perform an operation on data to be stored in the semiconductor device according to communication with an external apparatus.

The foregoing and/or other features and utilities of the present general inventive concept may also be achieved by providing a semiconductor device usable with an electronic apparatus, the semiconductor including a mounting substrate, a first semiconductor disposed on a top surface of the mounting substrate, a second semiconductor disposed over the first semiconductor and having a bottom surface spaced apart from a top surface of the first semiconductor, a top surface, and a side surface disposed between the bottom surface and the top surface, and a material unit having a first material formed between the first semiconductor and the second semiconductor and a second material formed to cover the top surface of the mounting substrate, bottom and side surfaces of the first semiconductor, bottom and side surfaces of the second semiconductor, and a side surface of the first material, the material unit having an internal boundary corresponding to the side surface of the first material and formed between the first semiconductor and the second semiconductor due to a characteristic difference between the first material and the second material.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
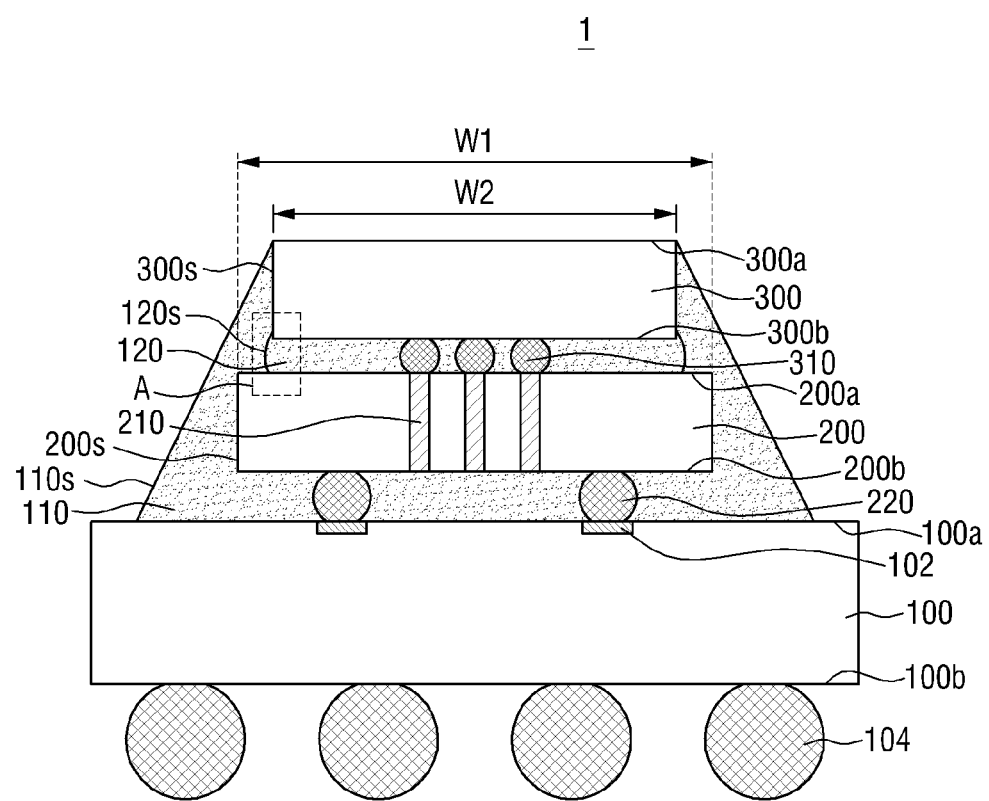
FIG. 1 is a diagram illustrating a semiconductor device according to an embodiment of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
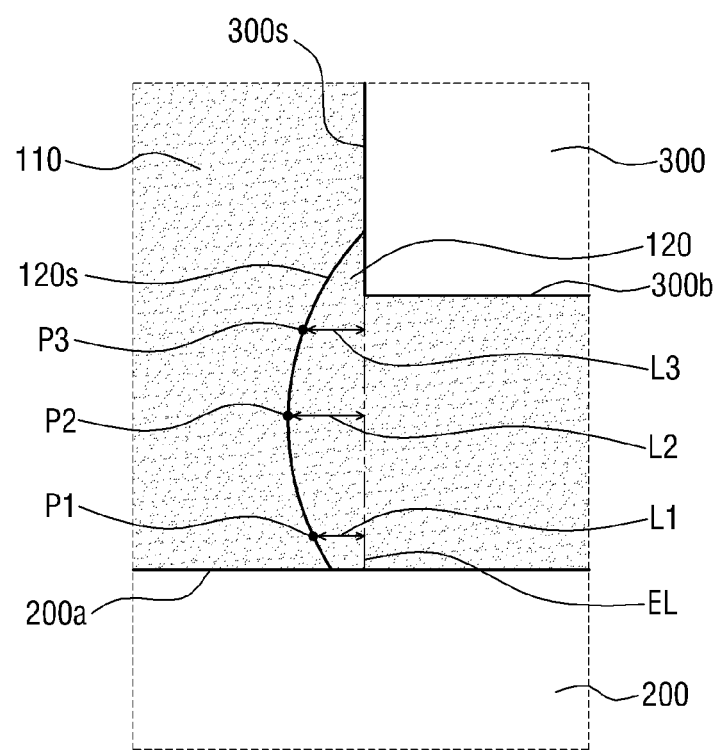
FIG. 2 is an enlarged view of a portion "A" of FIG. 1.

FIG. 1 is a diagram illustrating a semiconductor device 1 according to an embodiment of the present inventive concept. FIG. 2 is an enlarged view of a portion "A" of FIG. 1.

Referring to FIG. 1, the semiconductor device 1 according to an embodiment includes a mounting substrate 100, a lower semiconductor chip 200, an upper semiconductor chip 300, a first underfill material 120, a second underfill material 110, etc.

The mounting substrate 100 may be a substrate for a package. The mounting substrate 100 may be, for example, a printed circuit board (PCB) or a ceramic substrate. The mounting substrate 100 includes a top surface 100a and a bottom surface 100b which correspond to each other. External terminals 104 may be formed on the bottom surface 100b of the mounting substrate 100 to electrically connect the semiconductor device 1 to an external device. Bonding pads 102 may be electrically connected to the external terminals 104 which are connected to an external device and transmit electrical signals to the lower semiconductor chip 200 and the upper semiconductor chip 300. Alternatively, at least one of the bonding pads 102 may be, for example, a ground pad and may be electrically connected to a ground line within the mounting substrate 100. In FIG. 1, the bonding pads 102 are disposed in a middle portion of the mounting substrate 100. However, the present inventive concept is not limited thereto. It is possible that the bonding pads 102 may be disposed at a portion other than the middle portion of the mounting substrate 100.

The lower semiconductor chip 200 and the upper semiconductor chip 300 are disposed on the mounting substrate 100. For example, the lower semiconductor chip 200 and the upper semiconductor chip 300 may be disposed on the mounting substrate 100 to overlap each other or may be sequentially stacked on the mounting substrate 100.

The first underfill material 120 is disposed on the lower semiconductor chip 200. The first underfill material 120 is interposed between the lower semiconductor chip 200 and the upper semiconductor chip 300. The first underfill material 120 connects and bonds the lower semiconductor chip 200 and the upper semiconductor chip 300 together. The lower semiconductor chip 200, the first underfill material 120, and the upper semiconductor chip 300 are sequentially stacked on the mounting substrate 100.

The lower semiconductor chip 200 and the upper semiconductor chip 300 may be, for example, a memory chip, a logic chip, etc. When the lower semiconductor chip 200 and/or the upper semiconductor chip 300 are a logic chip, they may be designed in various ways in view of operations performed by the lower semiconductor chip 200 and/or the upper semiconductor chip 300. When the lower semiconductor chip 200 and/or the upper semiconductor chip 300 are a memory chip, the memory chip may be, for example, a nonvolatile memory chip. The memory chip may be a flash memory chip. The memory chip may be a NAND flash memory chip or a NOR flash memory chip. However, the present inventive concept is not limited thereto. It is possible that the memory chip may include any one of a phase-change random-access memory (PRAM), a magneto-resistive random-access memory (MRAM), and a resistive random-access memory (RRAM).

The lower semiconductor chip 200 may be electrically connected to the mounting substrate 100 by first connection terminals 220 formed on a bottom surface 200b of the lower semiconductor chip 200. That is, the first connection terminals 220 electrically connect the lower semiconductor chip 200 and the bonding pads 102 of the mounting substrate 100. In FIG. 1, the first connection terminals 220 are solder balls, but the present inventive concept is not limited thereto. The first connection terminals 220 may also solder bumps, each being a combination of a pillar and a solder ball.

Since the first connection terminals 220 which bond the mounting substrate 100 and the lower semiconductor chip 200 are located between the mounting substrate 100 and the lower semiconductor chip 200, the lower semiconductor chip 200 may be separated from the mounting substrate 100. That is, the top surface 100a of the mounting substrate 100 and the bottom surface 200b of the lower semiconductor chip 200 may be separated by at least a height of the first connection terminals 220.

The lower semiconductor chip 200 includes through-electrodes 210 which penetrate the lower semiconductor chip 200. In FIG. 1, three through electrodes 210 are formed in the lower semiconductor chip 200. However, this is merely an example used for ease of description, and the present inventive concept is not limited to this example. It is possible that the lower semiconductor chip 200 may have one, two, or more than three through electrondes.

The lower semiconductor chip 200 may be in the form of a flipchip, and the first connection terminals 220 may be formed on a surface of the lower semiconductor chip 200 on which a semiconductor element circuit is formed. However, the present inventive concept is not limited thereto. The first connection terminals 220 may have a portion disposed in the lower semiconductor chip 200.

In semiconductor devices according to the embodiment of the present inventive concept, the lower semiconductor chip 200 including the through electrodes 210 is a single chip. However, this is merely an example used for ease of description, and the present inventive concept is not limited thereto. The lower semiconductor chip 200 may include two or more than two semiconductor chips which are electrically connected as one chip unit.

The first underfill material 120 is disposed on a top surface 200a of the lower semiconductor chip 200. The first underfill material 120 may be of a film type. The first underfill material 120 bonds the top surface 200a of the lower semiconductor chip 200 and a bottom surface 300b of the upper semiconductor chip 300.

The first underfill material 120 includes a non-conductive material which does not conduct electricity. The first underfill material 120 may be, but is not limited to, a non-conductive film (NCF) or a die attach film (DAF). The first underfill material 120 may be a non-conductive sheet or plate.

The upper semiconductor chip 300 is disposed on the first underfill material 120. The upper semiconductor chip 300 may be bonded to the lower semiconductor chip 200 by the first underfill material 120. The first underfill material 120 may prevent the upper semiconductor chip 300 from being separated from the lower semiconductor chip 200 bonded to the mounting substrate 100.

Second connection terminals 310 formed on the bottom surface 300b of the upper semiconductor chip 300 are connected to the lower semiconductor chip 200, thereby connecting the upper semiconductor chip 300 and the lower semiconductor chip 200. The second connection terminals 310 may connect the upper semiconductor chip 300 to the through electrodes 210 formed in the lower semiconductor chip 200. The upper semiconductor chip 300 may be electrically connected to the lower semiconductor chip 200. The upper semiconductor chip 300 may be in the form of a flipchip, and the second connection terminals 310 may be formed on a surface of the upper semiconductor chip 300 on which a semiconductor element circuit is formed. In FIG. 1, the second connection terminals 310 are solder balls. However, the present inventive concept is not limited thereto, and the second connection terminals 310 may also be solder bumps, each being a combination of a pillar and a solder ball. The second connection terminals 310 may be micro-bumps.

The upper semiconductor chip 300 may be electrically connected to the mounting substrate 100 by the through electrodes 210 formed in the lower semiconductor chip 200. The upper semiconductor chip 300 may be electrically connected to the mounting substrate 100 by the second connection terminals 310, the through electrodes 210, and the first connection terminals 220.

The second connection terminals 310 which connect the upper semiconductor chip 300 and the lower semiconductor chip 200 penetrate the first underfill material 120. That is, the first underfill material 120 covers circumferences of the second connection terminals 310.

In semiconductor devices according to the embodiment of the present inventive concept, the upper semiconductor chip 300 electrically connected to the lower semiconductor chip 200 is a single chip. However, this is merely an example used for ease of description, and the present inventive concept is not limited to this example. The upper semiconductor chip 300 may include two or more than two semiconductor chips which are electrically connected as one chip unit The second underfill material 110 is formed on the mounting substrate 100 and fills a space between the mounting substrate 100 and the lower semiconductor chip 200. The second underfill material 110 entirely covers the first connection terminals 220 located between the lower semiconductor chip 200 and the mounting substrate 100. In addition, the underfill material 110 covers the lower semiconductor chip 200 and the first underfill material 120.

The second underfill material 110 may entirely cover side surfaces 200s of the lower semiconductor chip 200 and side surfaces 120s of the first underfill material 120. In addition, the second underfill material 110 may partially cover side surfaces 300s of the upper semiconductor chip 300. In FIG. 1, the second underfill material 110 entirely covers the side surfaces 300s of the upper semiconductor chip 300. However, this is merely an example used for ease of description, and the present inventive concept is not limited to this example.

The second underfill material 110 is not disposed on a top surface 300a of the upper semiconductor chip 300. That is, the top surface 300a of the upper semiconductor chip 300 is exposed to an outside of the semiconductor device 1 since the second underfill material 110 does not cover the top surface 300a of the upper semiconductor chip 300.

In semiconductor devices according to the embodiment of the present inventive concept, the second underfill material 110 fills the space between the mounting substrate 100 and the lower semiconductor chip 200 and covers the side surfaces 200s of the lower semiconductor chip 200 and the side surfaces 300s of the upper semiconductor chip 300. Therefore, a gap-fill material between the mounting substrate 100 and the lower semiconductor chip 200 and a material that covers the side surfaces 200s of the lower semiconductor chip 200 and the side surfaces 300s of the upper semiconductor chip 300 are a same material formed at a same level. Here, the "same level" denotes that the materials are formed by a same process.

The lower semiconductor chip 200 and the upper semiconductor chip 300 are bonded together by the film-type first underfill material 120. Therefore, the second underfill material 110 is not interposed between the top surface 200a of the lower semiconductor chip 200 and the bottom surface 300b of the upper semiconductor chip 300.

The second underfill material 110 may include a slope, that is, outer side surfaces 110s. That is, the outer side surfaces 110s of the second underfill material 110 which are not adjacent to the lower semiconductor chip 200 and the upper semiconductor chip 300 are exposed to an outside of the semiconductor device 1, and the slope corresponding to the outer side surfaces 110a may have a thickness from a reference line (or area) corresponding to side surfaces 200s or 300s, the thickness varying according to a distance from the lower or upper second semiconductor chip 200 or 300. The slope may be inclined by an angle formed with the top surface 100a of the mounting substrate 100 or an angle formed with the side surfaces 200s or 300s. The second underfill material 110 has the outer side surfaces 110s as the slope inclined with respect to a line perpendicular to a major surface of the substrate 100, the first semiconductor chip 200, and/or the second semiconductor chip 300 because it is a capillary underfill (CUF). The slope may correspond to a flat plane. However, the present general inventive concept is not limited thereto. It is possible that the slope may correspond to a curved surface area. It is also possible that the slope may correspond to an uneven surface.

The second underfill material 110 may include a material different from the film-type first underfill material. The second underfill material 110 may include an underfill material of a paste type, not a film type. The second underfill material 110 may include, for example, epoxy resin or two or more types of silicone hybrid materials.

Referring to FIG. 1, the lower semiconductor chip 200 may have a first width W1, and the upper semiconductor chip 300 may have a second width W2.

In the semiconductor device 1 according to the embodiment of the present inventive concept, the first width W1 of the lower semiconductor chip 200 is greater than the second width W2 of the upper semiconductor chip 300. Therefore, a portion of the first underfill material 120 interposed between the lower semiconductor chip 200 and the upper semiconductor chip 300 may protrude from the side surfaces 300s of the upper semiconductor chip 300. In addition, a portion of the first underfill material 120 may partially cover the side surfaces 300s of the upper semiconductor chip 300. The first underfill material 120 may have both opposite ends contacting the lower semiconductor chip 200 and the upper semiconductor chip 300. The opposite ends of the first underfill material 120 may contact a portion of the side surface 300a of the upper semiconductor chip 300.

A shape of the film-type first underfill material 120 which bonds the lower semiconductor chip 200 and the upper semiconductor chip 300 will now be described with reference to FIG. 2. A shape of the side surfaces 120s of the first underfill material 120 will also be described.

The number of the side surfaces 120s may be four, for example. However, the present general inventive concept is not limited thereto. The number of side surfaces 120s may vary according to a dimension or area of the lower or upper semiconductor chip 200 or 300. It is possible that the side surfaces 120s may be continuously connected such that the side surfaces 120s can be formed as a single side surface disposed around peripheral portions of the lower semiconductor chip 200 and/or the upper semiconductor chip 300.

Since the first underfill material 120 is a film (or sheet) type material, it has substantially no fluidity. However, the first underfill material 120 has fluidity before a process of curing the first underfill material 120. Therefore, if pressure is applied to the first underfill material 120, the first underfill material 120 may be forced to spread out laterally or expand along a space formed between the top surface 200 of the lower semiconductor chip 200 and the bottom surface 300b of the upper semiconductor chip 300. That is, if the first underfill material 120 is cured in a state where pressure is applied to the first underfill material 120, a portion of the first underfill material 120 may protrude laterally from the side surfaces 300s of the upper semiconductor chip 300. The portion of the first underfill material 120 may protrude from a line parallel to the side surfaces 300s of the upper semiconductor chip 300.

Each of the side surfaces 120s of the first underfill material 120 may include a first point P1, a second point P2, and a third point P3. The first point P1 is disposed close to the top surface 200a of the lower semiconductor chip 200, and the second point P2 is disposed farther than the first point P1 from the top surface 200a of the lower semiconductor chip 200. In addition, the third point P3 is disposed farther than the second point P2 from the top surface 200a of the lower semiconductor chip 200. That is, the first through third points P1 through P3 are located at gradually increasing distances from the top surface 200a of the lower semiconductor chip 200.

The first through third points P1 through P3 may have distances from an extension line EL of each of the side surfaces 300s of the upper semiconductor chip 300, and the distances may be referred to as a first distance L1, a second distance L2, and a third distance L3, respectively.

In a semiconductor device according to an embodiment of the present inventive concept, the distance L2 from the extension line EL of each of the side surfaces 300s of the upper semiconductor chip 300 to the second point P2 is longer than the distance L1 from the extension line EL of each of the side surfaces 300s of the upper semiconductor chip 300 to the first point P1. In addition, the distance L2 from the extension line EL of each of the side surfaces 300s of the upper semiconductor chip 300 to the second point P2 is longer than the distance L1 from the extension line EL of each of the side surfaces 300s of the upper semiconductor chip 300 to the third point P3.

In other words, the second point P2 located in the middle of each of the side surfaces 120s of the first underfill material 120 is farthest from the extension line EL of each of the side surfaces 300s of the upper semiconductor chip 300.

Therefore, a central portion of the first underfill material 120 has a largest width in a lateral (longitudinal) direction parallel to the top surface 200a of the lower semiconductor chip 200 and/or the bottom surface 300a of the upper semiconductor chip 300 between the lower and upper semiconductor chips 200 and 300, and portions of the first underfill material 120 which contact the upper semiconductor chip 300 and/or the lower semiconductor chip 200 have a smallest width. Also, the central portion of the first underfill material 120 may have a thickness in a thicknesswise direction between the lower semiconductor chip 200 and the upper semiconductor chip 300, and the portions of the first underfill material 120 which contact the upper semiconductor chip 300 and/or the lower semiconductor chip 200 may have a thickness larger than the thickness of the central portion.

The first underfill material 120 is shaped as described above because a portion of the first underfill material 120 which is separated from the upper semiconductor chip 300 and the lower semiconductor chip 200 can spread out farther than portions of the first underfill material 120 which contact the upper semiconductor chip 300 and the lower semiconductor chip 200.

As described above, a semiconductor device 1 usable with an electronic apparatus which will be described later may include a mounting substrate 100, a first semiconductor chip (lower semiconductor chip) 200 disposed on a top surface of the mounting substrate 100, a second semiconductor chip (upper semiconductor chip) 300 disposed over the first semiconductor chip 200, one or more connection terminals 310 electrically connecting the first semiconductor chip 200 and the second semiconductor chip 300, and a material unit having a first material 120 disposed between the first semiconductor chip 200 and the second semiconductor chip 300 and surrounding the one or more connection terminals 310, and also having a second material 110 disposed to cover portions of the first material 120, the first semiconductor chip 200, and the second semiconductor chip 300. The material unit may have a curved boundary formed at a contact area of the first material and the second material.

Also as described above, the semiconductor device 1 may be usable with an electronic apparatus which will be described later. The semiconductor device 1 may include the mounting substrate 100, a first semiconductor 200 disposed on the top surface 100a of the mounting substrate 100, a second semiconductor 300 disposed over the first semiconductor 200 and having the bottom surface 300b spaced apart from the top surface 200a of the first semiconductor 200, the top surface 300a, and the side surface 300S disposed between the bottom surface 300b and the top surface 300a, and a material unit having the first material 120 formed between the first semiconductor 200 and the second semiconductor 300 and the second material 110 formed to cover the top surface 100a of the mounting substrate 100, bottom and side surfaces 200b and 200s of the first semiconductor 200, bottom and side surfaces 300b and 300S of the second semiconductor 300, and the side surface 120S of the first material 120, the material unit having an internal boundary corresponding to the side surface 120s of the first material 120 and formed between the first semiconductor 200 and the second semiconductor 300 due to a characteristic difference between the first material 120 and the second material 110.

The first material 120 may include the film-type underfill material disposed between the first semiconductor 200 and the second semiconductor 300 to be cured to form the first material 120, and the second material 110 has an external boundary formed on an outer surface of the second material 110.

The boundary may include a curved area formed between the first semiconductor and the second semiconductor. The curved area may have opposite portions respectively connected to the first semiconductor and the second semiconductor and a middle portion between the opposite portions and protruding toward an external boundary of the second material.

The second material 110 may not be disposed on the top surface of the second semiconductor 300.

The electronic apparatus may include the semiconductor device described above or hereinafter, and a controller may control the semiconductor device to perform an operation on data according to communication with an external apparatus.

A semiconductor device according to an embodiment of the present inventive concept will now be described with reference to FIG. 3.

Figure 3:
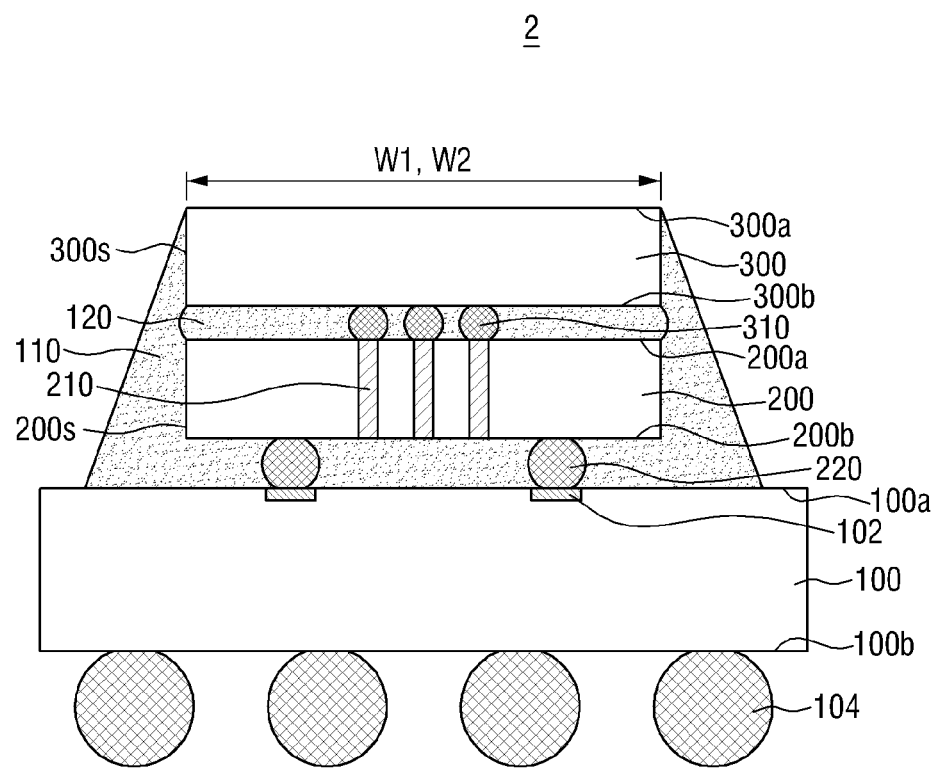
FIG. 3 is a diagram illustrating a semiconductor device according to an embodiment of the present inventive concept.

FIG. 3 is a diagram illustrating a semiconductor device 2 according to an embodiment of the present inventive concept. Since the semiconductor device 2 of FIG. 3 is similar to the semiconductor 1 of FIG. 1, detail descriptions of the similar portions will be omitted.

Referring to FIG. 3, a width W1 of a lower semiconductor chip 200 is substantially equal to a width W2 of an upper semiconductor chip 300.

During a fabrication process, if pressure is applied to the lower semiconductor chip 200 and the upper semiconductor chip 300 so as to bond them together, a first underfill material 120 may be forced to spread out laterally to protrude from the side surfaces 200s of the lower semiconductor chip 200 and the side surfaces 300s of the upper semiconductor chip 300.

As described above with reference to FIG. 2, in the semiconductor device 2 according to the embodiment of the present inventive concept, a central portion of the first underfill material 120 may have a largest width in a lateral (longitudinal) direction parallel to the top surface 200a of the lower semiconductor chip 200 and/or the bottom surface 300a of the upper semiconductor chip 300 between the lower and upper semiconductor chips 200 and 300, and portions of the first underfill material 120 which contact the upper semiconductor chip 300 and/or the lower semiconductor chip 200 have a smallest width. Also, the central portion of the first underfill material 120 may have a thickness in a thicknesswise direction between the lower semiconductor chip 200 and the upper semiconductor chip 300, and the portions of the first underfill material 120 which contact the upper semiconductor chip 300 and/or the lower semiconductor chip 200 may have a thickness larger than the thickness of the central portion.

In FIG. 3, the first underfill material 120 may protrude in a lateral (longitudinal) direction from a plane corresponding to the side surfaces 200s of the lower semiconductor chip 200 and the side surfaces 300s of the upper semiconductor chip 300 but may not cover the side surfaces 200s of the lower semiconductor chip 200 and the side surfaces 300s of the upper semiconductor chip 300. However, the present inventive concept is not limited thereto. That is, the first underfill material 120 may partially cover the side surfaces 300s of the upper semiconductor chip 300 and/or the side surfaces 200s of the lower semiconductor chip 200.

A semiconductor device according to an embodiment of the present inventive concept will now be described with reference to FIG. 4.

Figure 4:
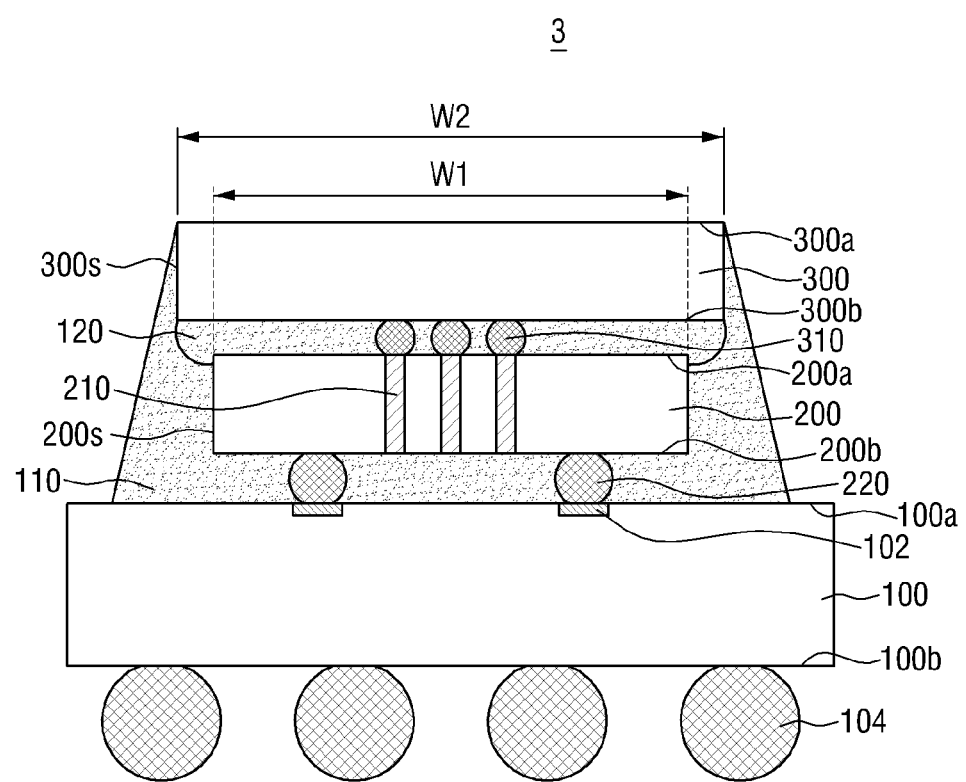
FIG. 4 is a diagram illustrating a semiconductor device according to an embodiment of the present inventive concept.

FIG. 4 is a diagram illustrating a semiconductor device 3 according to an embodiment of the present inventive concept. Since the semiconductor device 3 of FIG. 4 is similar to the semiconductor 1 of FIG. 1, detail descriptions of the similar portions will be omitted.

Referring to FIG. 4, a width W1 of a lower semiconductor chip 200 is smaller than a width W2 of an upper semiconductor chip 300.

A portion of a first underfill material 120 interposed between the lower semiconductor chip 200 and the upper semiconductor chip 300 may protrude from a plane corresponding to side surfaces 300s of the upper semiconductor chip 300. In addition, since the width W1 of the lower semiconductor chip 200 is smaller than the width W2 of the upper semiconductor chip 300, the first underfill material 120 may partially cover side surfaces 200s of the lower semiconductor chip 200.

As described above with reference to FIG. 2, in the semiconductor device 3 of FIG. 3, a central portion of the first underfill material 120 in a thicknesswise direction has a largest width in a lateral (longitudinal) direction parallel to a bottom surface 300b of the upper semiconductor chip 300 and/or a top surface 200a of the lower semiconductor chip 200, and a portion of the first underfill material 120 which contacts the lower semiconductor chip 200 has a smallest width in the lateral (longitudinal) direction.

In the semiconductor device 1 of FIG. 2, portions of the first underfill material 120 which contact the upper semiconductor chip 300 and/or the lower semiconductor chip 200 have a smallest width. However, in the semiconductor device 3 of FIG. 4, a portion of the first underfill material 120 which contacts the lower semiconductor chip 200 has a smallest width compared to a width of other portions since the first underfill material 120 of a film type is provided during a fabrication process in a state where it is attached to a bottom surface 300b of the upper semiconductor chip 300.

A semiconductor device according to an embodiment of the present inventive concept will now be described with reference to FIG. 5.

Figure 5:
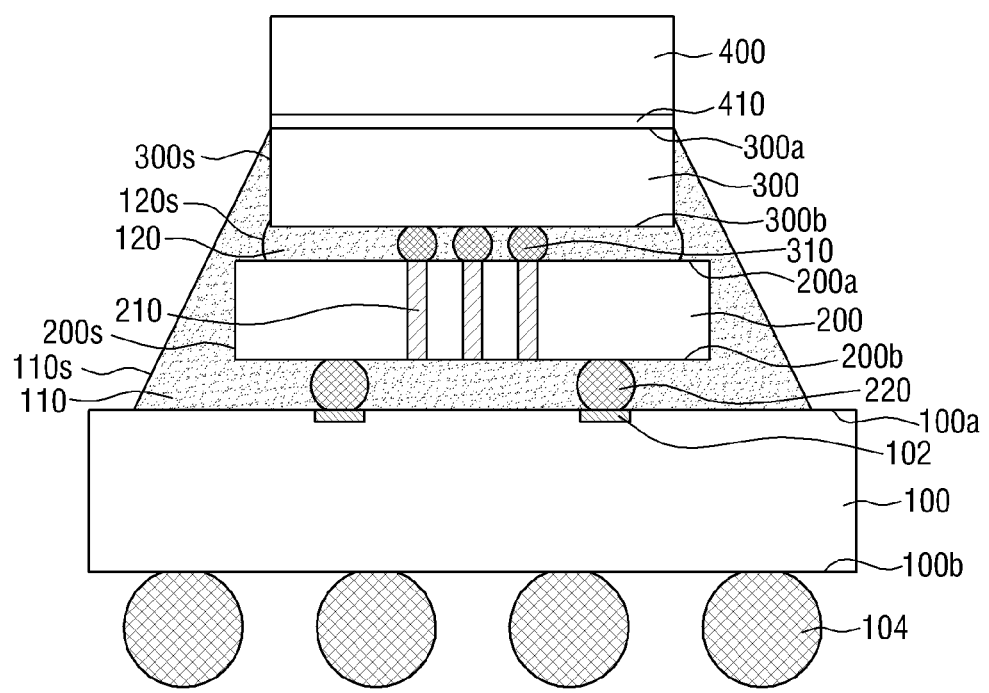
FIG. 5 is a diagram illustrating a semiconductor device according to an embodiment of the present inventive concept.

FIG. 5 is a diagram illustrating a semiconductor device 4 according to an embodiment of the present inventive concept. Since the semiconductor device 4 of FIG. 5 is similar to the semiconductor 1 of FIG. 1, detail descriptions of the similar portions will be omitted.

Referring to FIG. 5, the semiconductor device 4 according to an embodiment of the present inventive concept further includes a heat sink 400.

The heat sink 400 is disposed on an upper semiconductor chip 300. That is, a lower semiconductor chip 200, the upper semiconductor chip 300, and the heat sink 400 are sequentially stacked on a mounting substrate 100. The heat sink 400 may be in the form of, e.g., a flat plate or a thin foil. However, the present general inventive concept is not limited thereto. It is possible that the heat sink 400 can have a shape, dimension, or characteristic different from the flat plate or the thin foil.

The heat sink 400 may include a material having high heat conductivity. The heat sink 400 may be, for example, a metal plate or a metal foil. The heat sink 400 may be, but is not limited to, a copper plate, an aluminum plate, a copper foil, an aluminum foil, or a combination of the same.

A heat transfer material layer 410 may be interposed between the heat sink 400 and the upper semiconductor chip 300. That is, the heat transfer material layer 410 may be disposed between a top surface 300a of the upper semiconductor chip 300 and the heat sink 400. The heat transfer material layer 410 may be formed directly on the top surface 300a of the upper semiconductor chip 300. The heat transfer material layer 410 connects the heat sink 400 and the upper semiconductor chip 300. The heat transfer material layer 410 transfers heat generated by the upper semiconductor chip 300 and the lower semiconductor chip 200 to the heat sink 400.

The heat transfer material layer 410 includes a thermal interface material (TIM) and has adhesive characteristics. The heat transfer material layer 410 may be, but is not limited to, a curable adhesive material such as epoxy resin containing metal particles (e.g., silver (Ag)) or metal oxide particles (e.g., alumina ($Al_2O_3$)) or may be thermal grease containing particles such as diamond, aluminum nitride (AlN), alumina ($Al_2O_3$), zinc oxide (ZnO), or silver (Ag) particles.

In FIG. 5, a width of the heat sink 400 is substantially equal to a width of the upper semiconductor chip 300. However, this is merely an example used for ease of description, and the present inventive concept is not limited to this example. The width of the heat sink 400 may be determined according to a user or design preference.

That is, as long as the heat sink 400 is connected to the upper semiconductor chip 300 by the heat transfer material layer 410, the width of the heat sink 400 can be either larger or smaller than the width of the upper semiconductor chip 300.

A semiconductor device according to an embodiment of the present inventive concept will now be described with reference to FIG. 6.

Figure 6:
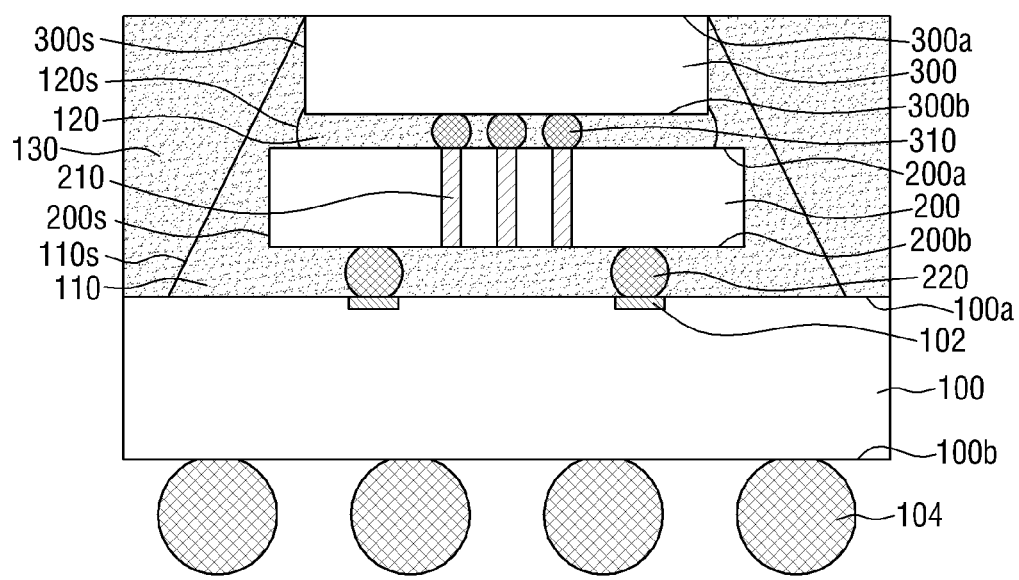
FIG. 6 is a diagram illustrating a semiconductor device according to an embodiment of the present inventive concept.

FIG. 6 is a diagram illustrating a semiconductor device 5 according to an embodiment of the present inventive concept. Since the semiconductor device 5 of FIG. 6 is similar to the semiconductor 1 of FIG. 1, detail descriptions of the similar portions will be omitted.

Referring to FIG. 6, the semiconductor device 5 according to an embodiment of the present inventive concept further includes a package molding material 130.

The package molding material 130 is formed on a mounting substrate 100. The package molding material 130 covers a second underfill material 110. The package molding material 130 exposes a top surface 300a of an upper semiconductor chip 300 to an outside of the semiconductor device 5. A top surface of the package molding material 130 and the top surface 300a of the upper semiconductor chip 300 may be disposed on the same plane.

The package molding material 130 may include, for example, an epoxy molding compound (EMC) or two or more types of silicone hybrid materials.

In FIG. 6, the package molding material 130 contacts side surfaces of the second underfill material 110 and does not contact side surfaces 300s of the upper semiconductor chip 300. However, the present inventive concept is not limited thereto.

That is, if the second underfill material 110 partially covers the side surfaces 300s of the upper semiconductor chip 300 and thus partially exposes the side surfaces 300s of the upper semiconductor chip 300, the package molding material 130 may cover the exposed portions of the side surfaces 300s of the upper semiconductor chip 300.

A semiconductor device according to an embodiment of the present inventive concept will now be described with reference to FIG. 7.

Figure 7:
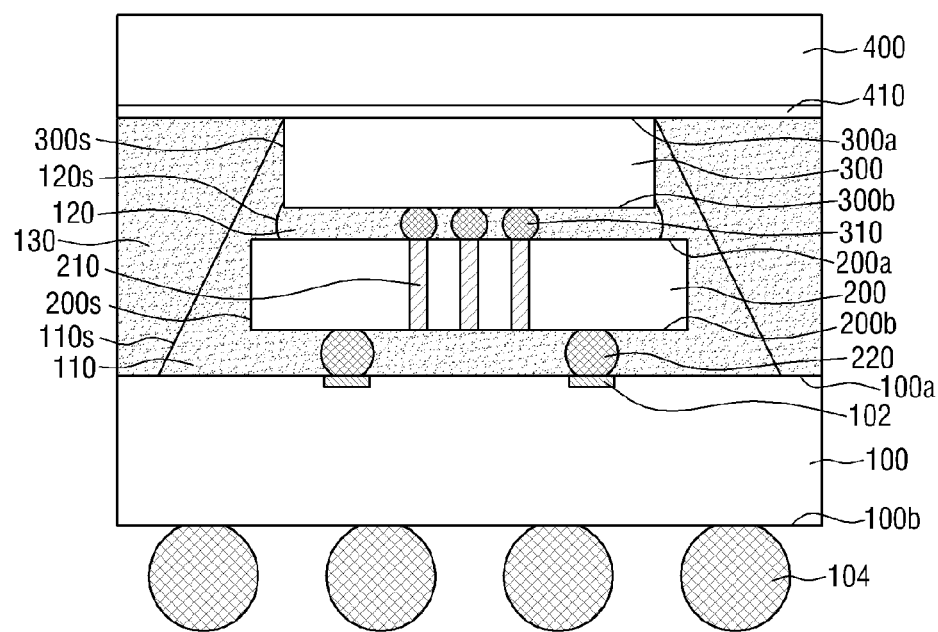
FIG. 7 is a diagram illustrating a semiconductor device according to an embodiment of the present inventive concept.

FIG. 7 is a diagram illustrating a semiconductor device 6 according to an embodiment of the present inventive concept. Since the semiconductor device 6 of FIG. 7 is similar to the semiconductor 1 of FIG. 1, detail descriptions of the similar portions will be omitted.

Referring to FIG. 7, the semiconductor device 6 according to an embodiment of the present inventive concept further includes a heat sink 400.

A heat transfer material layer 410 is formed on a top surface 300a of an upper semiconductor chip 300 and a top surface of a package molding material 130. The heat transfer material layer 410 may be formed directly on the top surface 300a of the upper semiconductor chip 300 and the top surface of the package molding material 130.

The heat sink 400 is formed on the heat transfer material layer 410. In other words, the heat sink 400 is formed on the upper semiconductor chip 300 and the package molding material 130 to overlap the upper semiconductor chip 300 and the package molding material 130.

A method of fabricating a semiconductor device according to an embodiment of the present inventive concept will now be described with reference to FIGS. 8 through 14. The method of fabricating the semiconductor device illustrated in FIGS. 8 through 14 according to the embodiment of the present inventive concept can be used to fabricate other semiconductor devices to be illustrated in FIGS. 15 and 16, for example.

FIGS. 8 through 14 are diagrams illustrating a method of fabricating a semiconductor device according to an embodiment of the present inventive concept.

Figure 8:
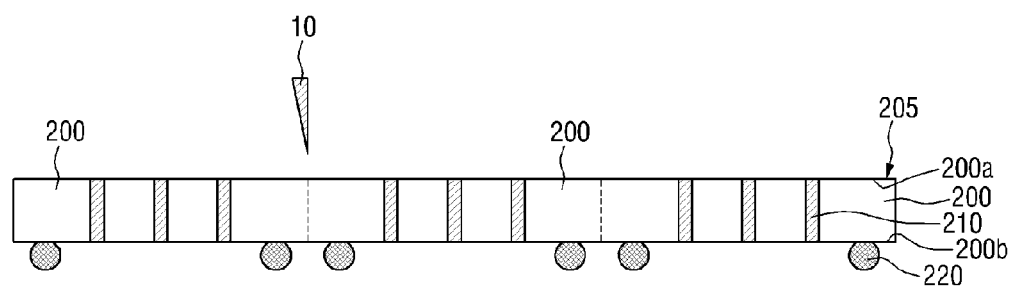
FIGS. 8 through 14 are diagrams illustrating a method of fabricating a semiconductor device according to an embodiment of the present inventive concept.

Referring to FIG. 8, a plurality of lower semiconductor chips 200 having first connection terminals 220 are provided.

A first semiconductor substrate 205 in which the lower semiconductor chips 200 are arranged is provided. The first semiconductor substrate 205 includes the lower semiconductor chips 200, each having through electrodes 210. The lower semiconductor chips 220 may be, for example, memory elements or logic elements.

The first connection terminals 220 are formed on a bottom surface 200b of each of the lower semiconductor chips 200. The first connection terminals 220 formed on a surface of each of the lower semiconductor chips 200 may serve as input and output terminals which receive and output electrical signals from and to the lower semiconductor chips 200.

Although not illustrated in FIG. 8, the first semiconductor substrate 205 having the first connection terminals 220 may be attached to a carrier.

Next, the first semiconductor substrate 205 is cut by a dicing process unit 10. The first semiconductor substrate 205 is cut into the lower semiconductor chips 200 by the dicing process 10.

That is, the lower semiconductor chips 200, each having the first connection terminals 220 formed on the bottom surface 200b thereof, are provided.

Figure 9:
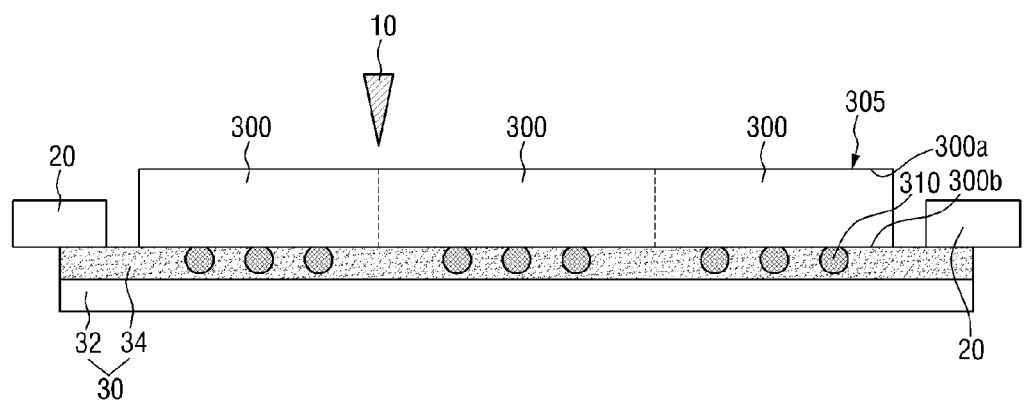
Figure 10:
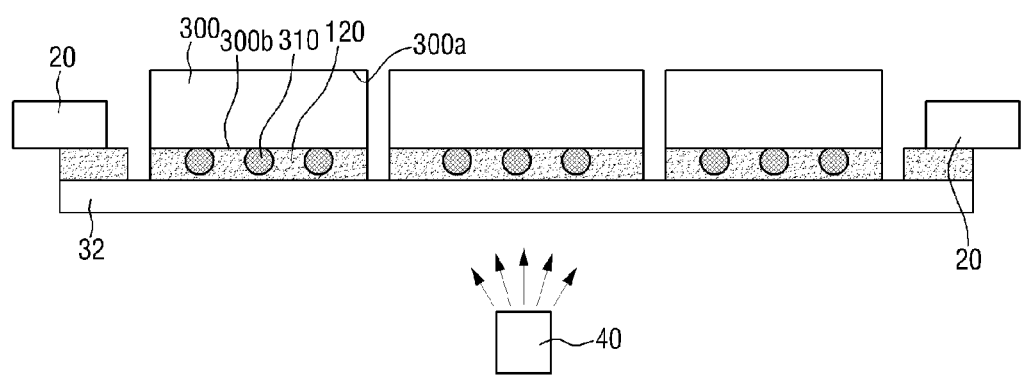

Referring to FIGS. 9 and 10, a plurality of upper semiconductor chips 300, each having second connection terminals 310 and a film-type first underfill material 120 formed on a bottom surface 300b of thereof, are provided.

A second semiconductor substrate 305 in which the upper semiconductor chips 300 are arranged is provided. The upper semiconductor chips 300 may be, for example, memory elements or logic elements.

The second connection terminals 310 are formed on the bottom surface 300b of each of the upper semiconductor chips 300. The second connection terminals 310 formed on a surface of each of the upper semiconductor chips 300, that is, the bottom surface 300b of each of the upper semiconductor chips 300 may serve as input and output terminals which receive and output electrical signals from and to the upper semiconductor chips 300.

The second semiconductor substrate 305 having the second connection terminals 310 is attached to a wafer ring 20 using an adhesive tape 30. The second semiconductor substrate 305 is attached to the wafer ring 20 such that the bottom surface 300b of each of the upper semiconductor chips 300 having the second connection terminals 310 faces the adhesive tape 30.

The adhesive tape 30 includes a lower adhesive film 32 and an upper adhesive film 34. The lower adhesive film 32 and the upper adhesive film 34 form a layer. The lower adhesive film 32 and the upper adhesive film 34 included in the adhesive tape 30 may be separated from each other by a process which will be described later. The upper adhesive film 34 may be, but is not limited to, a non-conductive film (NCF) or a DOW chemical company (Dow) adhesive film (DAF). The lower adhesive film 32 may be any material that can adhere to the upper adhesive film 34 and stretch in a subsequent expansion process.

The second semiconductor substrate 305 having the second connection terminals 310 may be attached to the upper adhesive film 34. In addition, the second connection terminals 310 may be enclosed in the upper adhesive film 34. That is, the bottom surface 300b of each of the upper semiconductor chips 300 contacts the upper adhesive film 34, and the second connection terminals 310 are surrounded by the upper adhesive film 34.

Next, the second semiconductor substrate 305 is cut by a dicing process unit 10. The second semiconductor substrate 305 is cut into the upper semiconductor chips 300 by the dicing process unit 10. The dicing process unit 10 at least partially separates the upper adhesive film 34 but not the lower adhesive film 32.

A distance between the upper semiconductor chips 300 is increased by the expansion process. The expansion process separates the upper adhesive film 34 attached to the bottom surface 300b of each of the upper semiconductor chips 300 into a plurality of sections. Each of the sections becomes the film-type first underfill material 120.

The first underfill material 120 and the lower adhesive film 32 are separated from each other by an optical separation process unit 40. The optical separation process unit 40 may use, for example, UV irradiation or laser irradiation.

Accordingly, the upper semiconductor chips 300, each having the second connection terminals 310 and the film-type first underfill material 120 formed on the bottom surface 300b thereof, are provided. The first underfill material 120 formed on the bottom surface 300b of each of the upper semiconductor chips 300 covers the second connection terminals 310 and the bottom surface 300b of each of the upper semiconductor chips 300. It is possible that a portion of the second connection terminals 319 is exposed to an outside thereof from the first underfill material 120. Like the lower semiconductor chips 200, each of the upper semiconductor chips 300 includes a top surface 300a and the bottom surface 300b.

Figure 11:
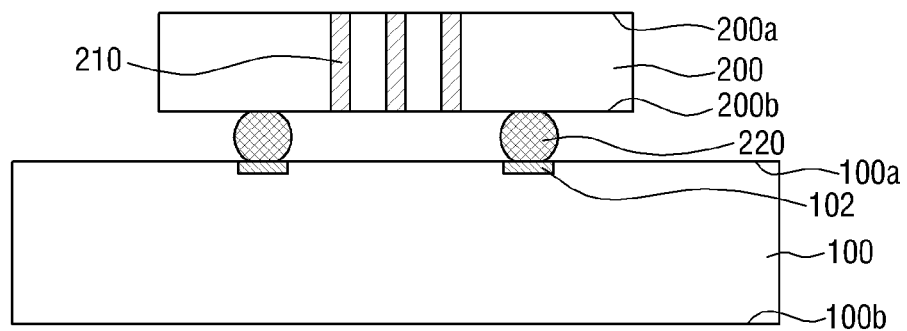

Referring to FIG. 11, a lower semiconductor chip 200 is bonded to a mounting substrate 100. The lower semiconductor chip 200 having the first connection terminals 220 is bonded onto a top surface 100a of the mounting substrate 100.

The lower semiconductor chip 200 is bonded to the mounting substrate 100 by the first connection terminals 220 formed on the bottom surface 200b thereof. As the lower semiconductor chip 200 and the mounting substrate 100 are bonded together, the lower semiconductor chip 200 and the mounting substrate 100 are electrically connected to each other. For example, the first connection terminals 220 may contact corresponding bonding pads 102 formed on the top surface 100a of the mounting substrate 100.

Figure 12:
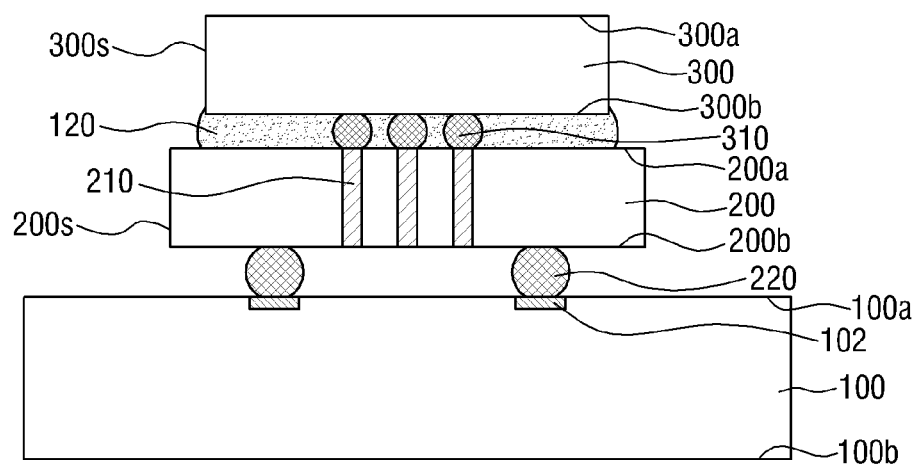

Referring to FIG. 12, the lower semiconductor chip 200 and an upper semiconductor chip 300 are bonded using the first underfill material 120.

The film-type first underfill material 120 is provided in a state where it is formed on the bottom surface 300b of the upper semiconductor chip 300. The upper semiconductor chip 300 having the first underfill material 120 is placed on the lower semiconductor chip 200. Using the first underfill material 120, the bottom surface 300b of the upper semiconductor chip 300 and a top surface 200a of the lower semiconductor chip 200 are bonded together.

When the lower semiconductor chip 200 and the upper semiconductor chip 300 are bonded together, the second connection terminals 310 formed on the bottom surface 300b of the upper semiconductor chip 300 which faces the lower semiconductor chip 200 are connected to the lower semiconductor chip 200. The second connection terminals 310 are connected to the corresponding through electrodes 210 formed in the lower semiconductor chip 200. Accordingly, the upper semiconductor chip 300 is electrically connected to the lower semiconductor chip 200. In addition, the upper semiconductor chip 300 is electrically connected to the mounting substrate 100.

Before the lower semiconductor chip 200 and the upper semiconductor chip 300 are bonded together, the first underfill material 120 may cover the second connection terminals 310. Therefore, after the lower semiconductor chip 200 and the upper semiconductor chip 300 are bonded together, the first underfill material 120 surrounds the second connection terminals 310.

If a width of the lower semiconductor chip 200 is greater than a width of the upper semiconductor chip 300 as illustrated in FIG. 12, when the upper semiconductor chip 300 is bonded to the lower semiconductor chip 200, the first underfill material 120 may partially cover side surfaces 300s of the narrower upper semiconductor chip 300. A portion of the top surface 200a may not be covered by the first underfill material 120.

As described above with reference to FIG. 3, if the width of the lower semiconductor chip 200 is substantially equal to the width of the upper semiconductor chip 300, the first underfill material 120 may not cover side surfaces 200s of the lower semiconductor chip 200 and the side surfaces 300s of the upper semiconductor chip 300. Alternatively, the first underfill material 120 may partially cover the side surfaces 300s of the upper semiconductor chip 300 and/or the side surfaces 200s of the lower semiconductor chip 200.

Further, as described above with reference to FIG. 4, when the width of the lower semiconductor chip 200 is smaller than the width of the upper semiconductor chip 300, the first underfill material 120 may partially cover the side surfaces 200s of the lower semiconductor chip 200.

Since the upper semiconductor chip 300 and the lower semiconductor chip 200 are bonded by the film-type first underfill material 120, a central portion of the first underfill material 120 may have a largest width in a lateral (longitudinal) direction, and portions of the first underfill material 120 which contact the upper semiconductor chip 300 and/or the lower semiconductor chip 200 may have a smallest width in the lateral (longitudinal) direction.

Figure 13:
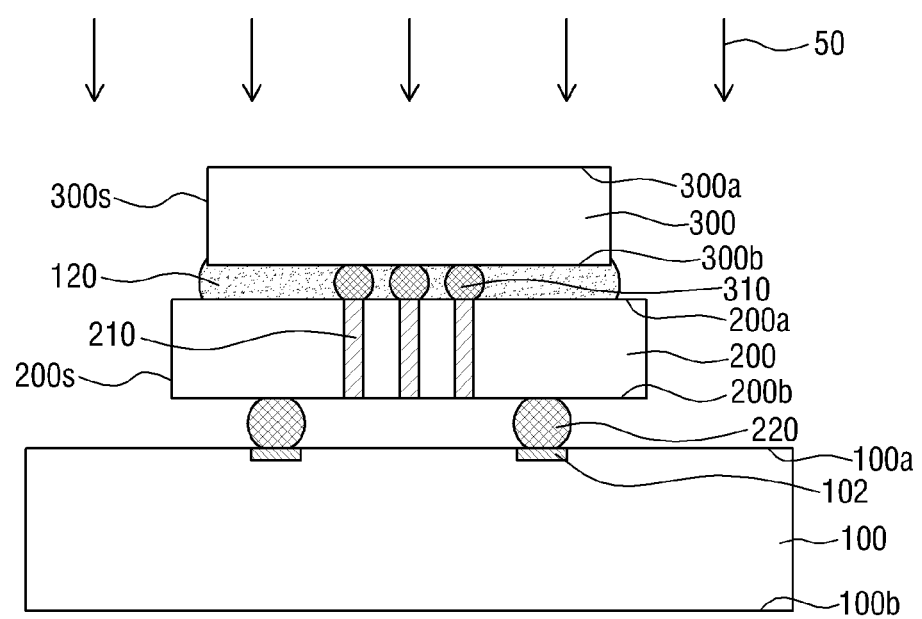

Referring to FIG. 13, the mounting substrate 100, the lower semiconductor chip 200, and the upper semiconductor chip 300 are plasma-treated by a plasma process unit 50.

The plasma treatment of the mounting substrate 100, the lower semiconductor chip 200 and the upper semiconductor chip 300 changes respective surfaces of the mounting substrate 100, the lower semiconductor chip 200 and the upper semiconductor chip 300 exposed to the plasma process 50 into surface states where a capillary action can occur readily.

In the plasma process 50, the bottom surface 200b of the lower semiconductor chip 200 and the top surface 100a of the mounting substrate 100 which faces the bottom surface 200b of the lower semiconductor chip 200 are also plasma-treated.

Figure 14:
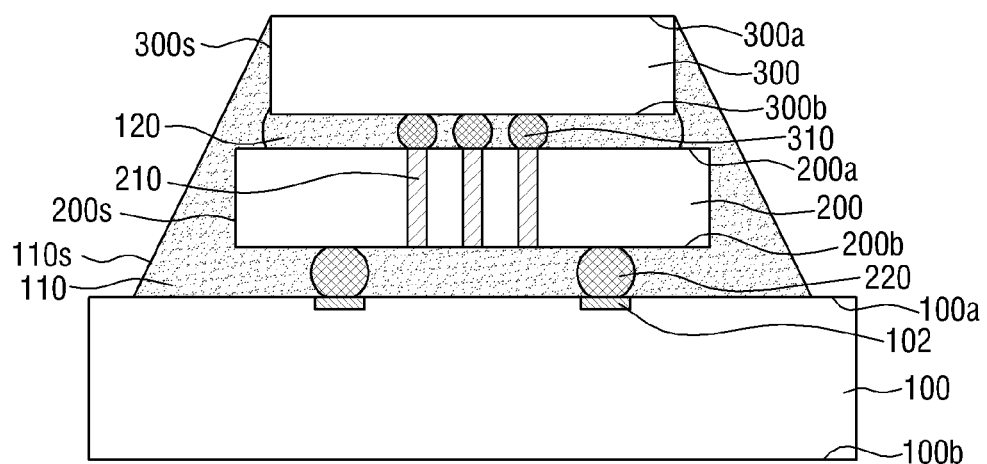

Referring to FIG. 14, a second underfill material 110 is formed to fill a space between the mounting substrate 100 and the lower semiconductor chip 200. In addition, the second underfill material 110 at least partially covers the side surfaces 200s of the lower semiconductor chip 200 and the side surfaces 300s of the upper semiconductor chip 300.

The second underfill material 110 filling the space between the bottom surface 200b of the lower semiconductor chip 200 and the top surface 100a of the mounting substrate 100 entirely covers the first connection terminals 220.

The second underfill material 110 may be formed using a capillary underfill method. More specifically, a material that forms the second underfill material 110 is dispensed on the top surface 100a of the mounting substrate 100. The dispensed material that forms the second underfill material 110 flows between the bottom surface 200b of the lower semiconductor chip 200 and the top surface 100a of the mounting substrate 100. In addition, the dispensed material that forms the second underfill material 110 flows along the side surfaces 200s of the lower semiconductor chip 200 and the side surfaces 300s of the upper semiconductor chip 300.

The dispensed material that forms the second underfill material 110 can flow along the space between the bottom surface 200b of the lower semiconductor chip 200 and the top surface 100a of the mounting substrate 100 and along the side surfaces 200s of the lower semiconductor chip 200 and the side surfaces 300s of the upper semiconductor chip 300 because the above surfaces have been plasma-treated by the plasma process unit 50.

While the second underfill material 110 is formed using the capillary underfill method, it is not formed between the lower semiconductor chip 200 and the upper semiconductor chip 300. That is, since the film-type first underfill material 120 that entirely covers the bottom surface 300b of the upper semiconductor chip 300 bonds the lower semiconductor chip 200 and the upper semiconductor chip 300 together, the second underfill material 110 is not interposed between the lower semiconductor chip 200 and the upper semiconductor chip 300. In other words, the second underfill material 110 is not present between the top surface 200a of the lower semiconductor chip 200 and the bottom surface 300b of the upper semiconductor chip 300.

The plasma process unit 50 plasma-treats the top surface 300a of the upper semiconductor chip 300, but the second underfill material 110 may not be formed on the top surface 300a of the upper semiconductor chip 300. That is, the top surface 300a of the upper semiconductor chip 300 is exposed by the second underfill material 110.

Since the second underfill material 110 is formed using the capillary underfill method, it may have a slope corresponding to outer side surfaces 110s.

In FIG. 14, the second underfill material 110 entirely covers the side surfaces 300s of the upper semiconductor chip 300. However, the present inventive concept is not limited thereto.

Side surfaces of the first underfill material 120 are also plasma-treated by the plasma process unit 50 as described above with reference to FIG. 13. Therefore, the second underfill material 110 also covers the first underfill material 120 which protrudes from the side surfaces 300s of the upper semiconductor chip 300.

Referring to FIG. 1, external terminals 104 are formed on a bottom surface 100b of the mounting substrate 100.

A method of fabricating the semiconductor device 2 according to an embodiment of the present inventive concept will now be described with reference to FIGS. 8 through 15. The method of fabricating the semiconductor device 2 according to an embodiment of the present inventive concept can be used to fabricate other semiconductor device according to an embodiment of the present inventive concept.

Figure 15:
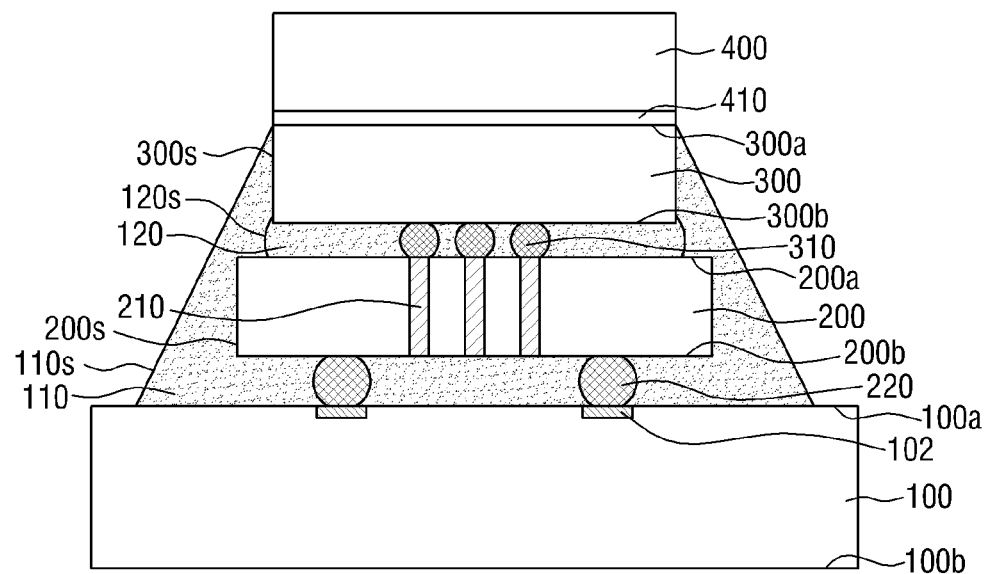
FIG. 15 is a diagram illustrating a method of fabricating a semiconductor device according to an embodiment of the present inventive concept.

FIG. 15 is a diagram illustrating a method of fabricating a semiconductor device according to a second embodiment of the present inventive concept.

Referring to FIG. 15, a heat sink 400 is formed on an upper semiconductor chip 300.

A second underfill material 110 is formed to more rapidly and efficiently remove heat generated by a lower semiconductor chip 20 and the upper semiconductor chip 300 stacked sequentially. After the formation of the second underfill material 110, the heat sink 400 may be formed on a top surface 300a of the upper semiconductor chip 300.

A heat transfer material layer 410 is formed on the top surface 300a of the upper semiconductor chip 300 exposed by the second underfill material 110.

Then, the heat sink 400 is placed on the heat transfer material layer 410. The heat transfer material layer 410 serves as an adhesive between the heat sink 400 and the upper semiconductor chip 300.

A method of fabricating a semiconductor device according to an embodiment of the present inventive concept will now be described with reference to FIGS. 8 through 16. The method of fabricating the semiconductor device according to the embodiment of the present inventive concept can be used to fabricate other semiconductor device according to an embodiment of the present inventive concept.

Figure 16:
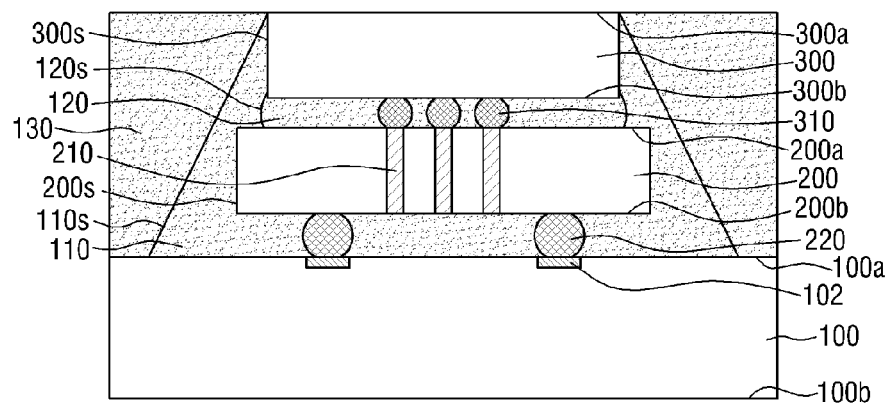
FIG. 16 is a diagram illustrating a method of fabricating a semiconductor device according to an embodiment of the present inventive concept.

FIG. 16 is a diagram illustrating a method of fabricating a semiconductor device according to an embodiment of the present inventive concept.

Referring to FIG. 16, a package molding material 130 is formed on a mounting substrate 100 to cover a second underfill material 110.

The package molding material 130 is not formed on a top surface 300a of an upper semiconductor chip 300. That is, the top surface 300a of the upper semiconductor chip 300 is exposed by the package molding material 130. A top surface of the package molding material 130 and the top surface 300a of the upper semiconductor chip 300 may be disposed on the same plane.

The package molding material 130 is formed using a mold. Therefore, the package molding material 130 may also be formed on the top surface 300a of the upper semiconductor chip 300. In this case, the package molding material 130 formed on the top surface 300a of the upper semiconductor chip 300 is removed by a planarization process, thereby exposing the top surface 300a of the upper semiconductor chip 300.

Figure 17:
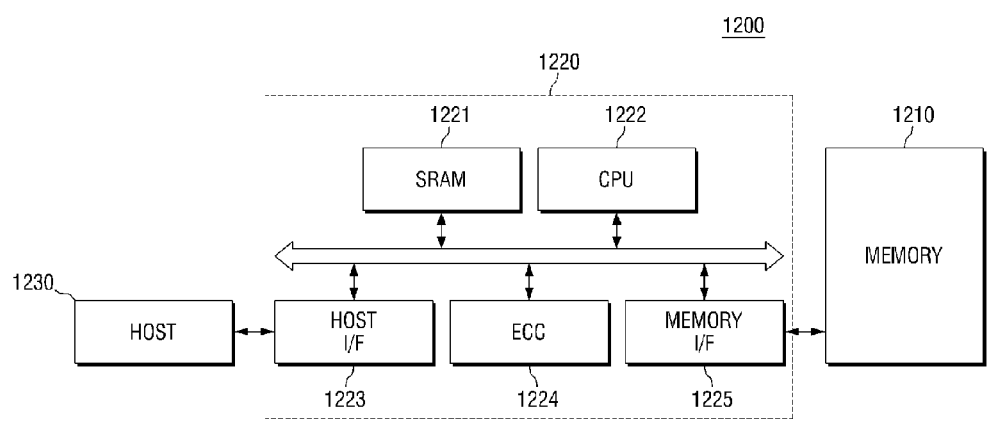
FIG. 17 is a block diagram illustrating a memory card including semiconductor devices according to an embodiment of the present inventive concept.

FIG. 17 is a block diagram illustrating a memory card 1200 including one or more semiconductor devices according to an embodiment of the present inventive concept.

Referring to FIG. 17, a memory 1210 including one or more semiconductor devices illustrated in FIGS. 1 through 16 may be employed in the memory card 1200. The memory card 1200 may include a memory controller 1220 which controls data exchange between a host 1230 and the memory 1210. A static random access memory (SRAM) 1221 may be used as an operating memory of a central processing unit (CPU) 1222. A host interface 1223 may include a protocol used by the host 1230 to access the memory card 1220 and exchange data with the memory card 1200. An error correction code (ECC) 1224 may detect and correct errors included in data read from the memory 1210. A memory interface 1225 may interface with the memory 1210. The CPU 1222 may perform the overall control operation for data exchange of the memory controller 1220. The memory card 120 may have a portion (not illustrated) connected to the host interface 1223 to be detachably attached to a terminal (not illustrated) of the host 1230. It is possible that the memory card 120 and the host 1230 may be connected according to a wired or wireless communication method. The one or more semiconductor devices may be a same semiconductor device or a combination of different semiconductor devices illustrated in FIGS. 1 through 16.

Figure 18:
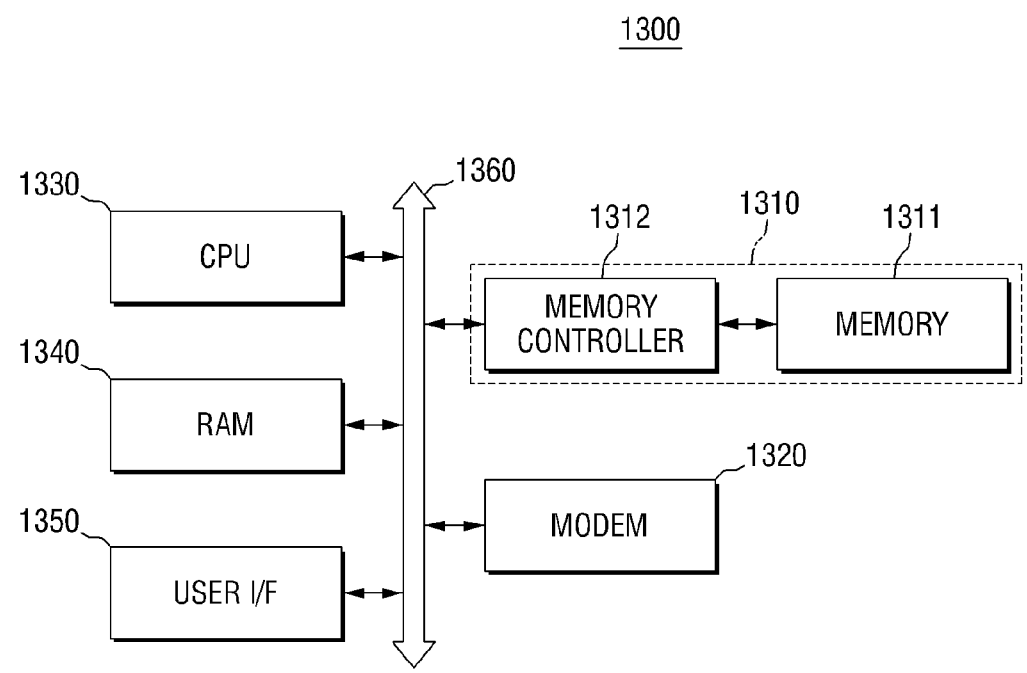
FIG. 18 is a block diagram illustrating an information processing system using semiconductor devices according to an embodiment of the present inventive concept.

FIG. 18 is a block diagram illustrating an information processing system 1300 using one or more semiconductor devices according to an embodiment of the present inventive concept.

Referring to FIG. 18, the information processing system 1300 may include a memory system 1310 including one or more semiconductor devices illustrated in FIGS. 1 through 16. The information processing system 1300 may include the memory system 1310, a modem 1320, a CPU 1330, a random access memory (RAM) 1340, and a user interface 1350 which are electrically connected to a system bus 1360. The memory system 1310 may include a memory 1311 and a memory controller 1312 and may have substantially the same configuration as the memory card 1200 of FIG. 9. Data processed by the CPU 1330 or data received from an external device may be stored in the memory system 1310. The information processing system 1300 can be applied to a memory card, a solid-state drive (SSD), a camera image sensor and various other chipsets. For example, the memory system 1300 may be configured to employ an SSD. In this case, the information processing system 1300 can process large-volume data in a stable and reliable manner.

Figure 19:
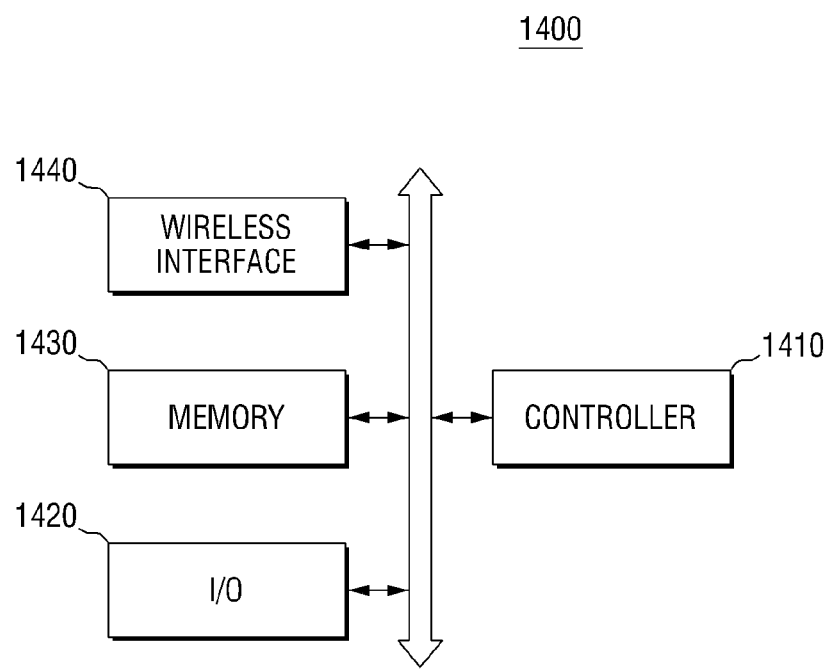
FIG. 19 is a block diagram illustrating an electronic device including semiconductor devices according to an embodiment of the present inventive concept.

FIG. 19 is a block diagram illustrating an electronic device 1400 including one or more semiconductor devices according to an embodiment of the present inventive concept.

Referring to FIG. 19, the electronic device 1400 may include one or more semiconductor devices fabricated according to an embodiment of the present inventive concept. The electronic device 1400 can be used in wireless communication devices (such as personal data assistants (PDAs), notebook computers, portable computers, web tablets, wireless phones, and/or wireless digital music players) or in various devices that exchange information in a wireless communication environment.

The electronic device 1400 may include a controller 1410, an input/output (I/O) device 1420, a memory 1430, and a wireless interface 1440. The memory 1430 may include one or more semiconductor devices fabricated according to an embodiment of the present inventive concept. The controller 1410 may include at least one of a microprocessor, a digital signal processor, or the like. The memory 1430 may store commands (or user data) processed by the controller 1410. The wireless interface 1440 may be used to exchange data over a wireless communication network. The wireless interface 1440 may be an antenna and/or a wireless transceiver. The electronic device 1400 may use may use a third-generation communication system protocol such as Code Division Multiple Access (CDMA), Global System for Mobile communication (GSM), North 20 American Digital Cellular (NADC), Enhanced-Time Division Multiple Access (E-TDMA), Wideband CDMA (WCDMA), or CDMA-2000.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of fabricating a semiconductor device, the method comprising:
   providing a first semiconductor chip including one or more first connection terminals;
   providing a second semiconductor chip including top and bottom surfaces, and including second connection terminals and a film-type first underfill material formed on the bottom surface thereof;
   bonding the first semiconductor chip to a mounting substrate by using the first connection terminals;
   bonding the first semiconductor chip and the second semiconductor chip by using the first underfill material; and
   forming a second underfill material which fills a space between the mounting substrate and the first semiconductor chip and covers side surfaces of the first semiconductor chip and at least a portion of side surfaces of the second semiconductor chip.

2. The method of claim 1, wherein when the first semiconductor chip and the second semiconductor chip are bonded together, the first underfill material partially covers the side surfaces of the second semiconductor chip.

3. The method of claim 1, wherein when the first semiconductor chip and the second semiconductor chip are bonded together, the first underfill material partially covers the side surfaces of the first semiconductor chip.

4. The method of claim 1, wherein the forming of the second underfill material comprises exposing the top surface of the second semiconductor chip.

5. The method of claim 4, further comprising:
   forming a heat sink on the top surface of the second semiconductor chip after the forming of the second underfill material.

6. The method of claim 1, wherein the second underfill material is formed using a capillary underfill method.

7. The method of claim 6, further comprising:
   plasma-treating the mounting substrate, the first semiconductor chip, and the second semiconductor chip before the forming of the second underfill material.

8. The method of claim 1, further comprising:
   forming a molding material, which covers the second underfill material and exposes the top surface of the second semiconductor chip, on the mounting substrate.

9. The method of claim 1, wherein:
   the first semiconductor chip comprises through electrodes; and
   when the first semiconductor chip and the second semiconductor chip are bonded together, the through electrodes are connected to the second connection terminals.

10. A method of fabricating a semiconductor device, the method comprising:
    electrically connecting a first semiconductor chip having first connection terminals to a mounting substrate by using the first connection terminals;
    bonding the first semiconductor chip connected to the mounting substrate to a second semiconductor chip by using a film-type first underfill material;
    plasma-treating the mounting substrate, the first semiconductor chip, and the second semiconductor chip; and
    forming a second underfill material to cover the first connection terminals, to fill a space between the mounting substrate and the first semiconductor chip, and to cover side surfaces of the first semiconductor chip and at least a portion of side surfaces of the second semiconductor chip, by using a capillary underfill method after the plasma-treating of the mounting substrate, the first semiconductor chip, and the second semiconductor chip.

11. The method of claim 10, wherein:
    the first semiconductor chip comprises through electrodes; and
    when the first semiconductor chip and the second semiconductor chip are bonded together, second connection terminals formed on a surface of the second semiconductor chip disposed to face the first semiconductor chip are connected to the through electrodes.

12. The method of claim 11, wherein:
    the first underfill material covers the second connection terminals; and
    the second underfill material is not interposed between the first semiconductor chip and the second semiconductor chip.

13. The method of claim 10, wherein when the first semiconductor chip and the second semiconductor chip are bonded together, the first underfill material is provided in a state where the first underfill material is formed on the surface of the second semiconductor chip.

14. The method of claim 10, wherein:
a width of the first semiconductor chip is greater than a width of the second semiconductor chip; and
when the first semiconductor chip and the second semiconductor chip are bonded together, the first underfill material partially covers the side surfaces of the second semiconductor chip.

15. The method of claim 10, wherein:
the width of the first semiconductor chip is smaller than the width of the second semiconductor chip; and
when the first semiconductor chip and the second semiconductor chip are bonded together, the first underfill material partially covers the side surfaces of the first semiconductor chip.

16. A semiconductor device usable with an electronic apparatus, comprising:
a mounting substrate;
a first semiconductor chip disposed on a top surface of the mounting substrate;
a second semiconductor chip disposed over the first semiconductor chip;
one or more connection terminals electrically connecting the first semiconductor chip and the second semiconductor chip; and
a material unit having a first material disposed between the first semiconductor chip and the second semiconductor chip and surrounding the one or more connection terminals, and having a second material disposed to cover portions of the first material, the first semiconductor chip, and the second semiconductor chip, the material unit having a curved boundary formed at a contact area of the first material and the second material,
wherein the first material covers a lower surface of the second semiconductor chip facing the first semiconductor chip and at least a portion of a side surface of the second semiconductor chip.

17. The semiconductor device of claim 16, wherein the curved boundary comprises opposite ends respectively contacting the first semiconductor chip and the second semiconductor chip and a middle portion being curved between the opposite ends.

18. The semiconductor device of claim 16, wherein the curved boundary comprises a middle portion protruding from at least one of the first semiconductor chip and the second semiconductor chip in a lateral direction.

19. The semiconductor device of claim 16, wherein the second material is not disposed on a top surface of the second semiconductor chip.

20. An electronic apparatus comprising:
the semiconductor device of claim 16; and
a controller to control the semiconductor device to perform an operation on data to be stored in the semiconductor device according to communication with an external apparatus.

21. The semiconductor device of claim 16, wherein the first material is a curable film-type material having substantially no fluidity.

22. The semiconductor device of claim 21, wherein the first material is a curable film-type material having fluidity prior to curing and having substantially no fluidity after curing, the first material having been cured to have substantially no fluidity.

* * * * *